United States Patent [19]

Coleman et al.

[11] 4,070,689
[45] Jan. 24, 1978

[54] SEMICONDUCTOR SOLAR ENERGY DEVICE

[75] Inventors: Michael G. Coleman, Tempe; Fabio Restrepo, Scottsdale, both of Ariz.

[73] Assignee: Motorola Inc., Chicago, Ill.

[21] Appl. No.: 645,572

[22] Filed: Dec. 31, 1975

[51] Int. Cl.² ............................................. H01L 27/14
[52] U.S. Cl. ................................. 357/30; 136/89 CC
[58] Field of Search .................... 357/30, 32, 54, 71, 357/31; 136/89 CC

[56] References Cited

U.S. PATENT DOCUMENTS

| 3,437,527 | 4/1969 | Webb | 357/30 |
|---|---|---|---|
| 3,457,467 | 7/1969 | Amsterdam et al. | 357/30 |
| 3,460,240 | 8/1969 | Tarneja et al. | 357/30 |
| 3,512,051 | 5/1970 | Noll | 357/71 |
| 3,523,038 | 8/1970 | Sanders | 357/71 |
| 3,877,058 | 4/1975 | Cricchi | 357/30 |

FOREIGN PATENT DOCUMENTS 2,230,086   12/1974   France .................................. 136/89

OTHER PUBLICATIONS

Kaplan, "Electrically Controllable Read-Only Storage Device," IBM Technical Disclosure Bulletin, vol. 13, No. 5, Oct. 1970, p. 1268.
Forbes, "Photodiode Having Ion Implant for Improved Light Sensitivity," IBM Technical Disclosure Bulletin, vol. 15, No. 4, Sept. 1972, p. 1348.
Hovel et al., "Method for Si and GaAs Solar Cell Diffusion," IBM Technical Disclosure Bulletin, vol. 16, No. 7, Dec. 1973, pp. 2083-2084.

Primary Examiner—Stanley D. Miller, Jr.
Assistant Examiner—James W. Davie
Attorney, Agent, or Firm—Lowell E. Clark

[57] ABSTRACT

This disclosure relates to a semiconductor solar energy device which is of the PN-type and utilizes a dielectric anti-reflective coating on the side of the device that faces the sunlight. The fabrication techniques used in making this semiconductor device include the use of ion implantation to form doped or diffused regions in the device. One of the ion implanted regions located on the side of the device that is subjected to the sunlight is configured in order to permit metal ohmic contact to be made thereto without shorting through the doped region during sintering of the metal contacts to the semiconductor substrate. The dielectric anti-reflective coating, in one embodiment, is a composite of silicon dioxide and silicon nitride layers. The device is designed to permit solder contacts to be made to the P and N regions thereof without possibility of shorting to semiconductor regions of opposite type conductivity.

5 Claims, 2 Drawing Figures

SEMICONDUCTOR SOLAR ENERGY DEVICE

BACKGROUND OF THE INVENTION

1. Field of the Invention.

This invention relates generally to semiconductor solar energy devices and fabrication methods therefor and, more particularly, to semiconductor solar energy devices of the PN diode type having an anti-reflective coating on one side thereof, and fabrication methods for making such devices.

2. Description of the Prior Art.

In the past, semiconductor solar energy devices were made using PN diode type structures wherein an anti-reflective coating of a dielectric such as tantalum oxide or silicon monoxide was used on the sunlight-striking side of the solar energy device. Unfortunately, these two materials are not commonly used in silicon devices and therefore, present manufacturing problems. In this prior art type of semiconductor solar energy device, ohmic contacts were formed to the backside thereof and also to the front side of the device. Prior art techniques and method steps for making semiconductor solar energy devices were generally very complex and therefore very costly. The ohmic contacts to the front side of the device which was on the same side as the anti-reflective coating generally provided a problem because these metal contacts very often shorted through the underlying diffused regions into the semiconductor region of opposite type conductivity located beneath the diffused region on which the contacts were located. It was generally undesirable to provide a diffused region on the sunlight striking side of the device which would have a thickness greater than 0.3 microns. The reason for this is that a shallow PN junction is necessary for optimum collection of generated electron-hole pairs created by photon bombardment when subjected to solar energy. Consequently, during sintering of the metal ohmic contacts on the sunlight-striking side of the prior art semiconductor solar energy devices punch through or shorting problems developed in fabricating these types of devices.

Another problem associated with the prior art semiconductor solar energy devices is that the metal contacts that were applied to the semiconductor solar energy device required several costly or low manufacturing yield steps which made the prior art devices either unreliable or more expensive to manufacture.

An optimum process for solar cells should have the following features:

1. Minimum number of total steps.
2. Minimum number of photoresist steps.
3. Dopant concentration a maximum at the semiconductor surface, monotonically decreasing into the bulk.
4. Heavier dopant concentration below metallization areas for improved ohmic contact.
5. Greater junction depth below metallization than active areas to reduce the possibility of metal punch-through, while retaining cell sensitivity.
6. Have an anti-reflective coating.
7. Minimize wafer exposure time to high temperatures.

A need existed for providing a semiconductor solar energy device and process therefor that would overcome these disadvantages of prior art devices and processes and which would have the above identified process features to permit large quantities of these devices to be manufactured at relatively lower cost.

SUMMARY OF THE INVENTION

Accordingly, it is an object of this invention to provide an improved semiconductor solar energy device and fabrication method therefor.

It is another object of this invention to provide an improved semiconductor solar energy device and fabrication method therefor which has reliable ohmic contacts that do not short out a semiconductor region of opposite type conductivity located beneath the semiconductor region to which the ohmic contacts are made.

It is still a further object of this invention to provide a semiconductor solar energy device and fabrication methods therefor which is designed to prevent shorting from the metal contacts to a PN junction located in the substrate.

It is still another object of this invention to provide a semiconductor solar energy device and fabrication method therefor which utilizes an improved anti-reflective coating or layered structure which consists of semiconductor compatible materials that are easily applied using semiconductor manufacturing techniques.

It is a still further object of this invention to provide a simplified manufacturing process for making an improved semiconductor solar energy device.

The foregoing and other objects, features and advantages of the invention will be apparent from the following more particular description of the preferred embodiments of the invention, as illustrated in the accompanying drawings.

DESCRIPTION OF THE SPECIFICATION

Figure 1:
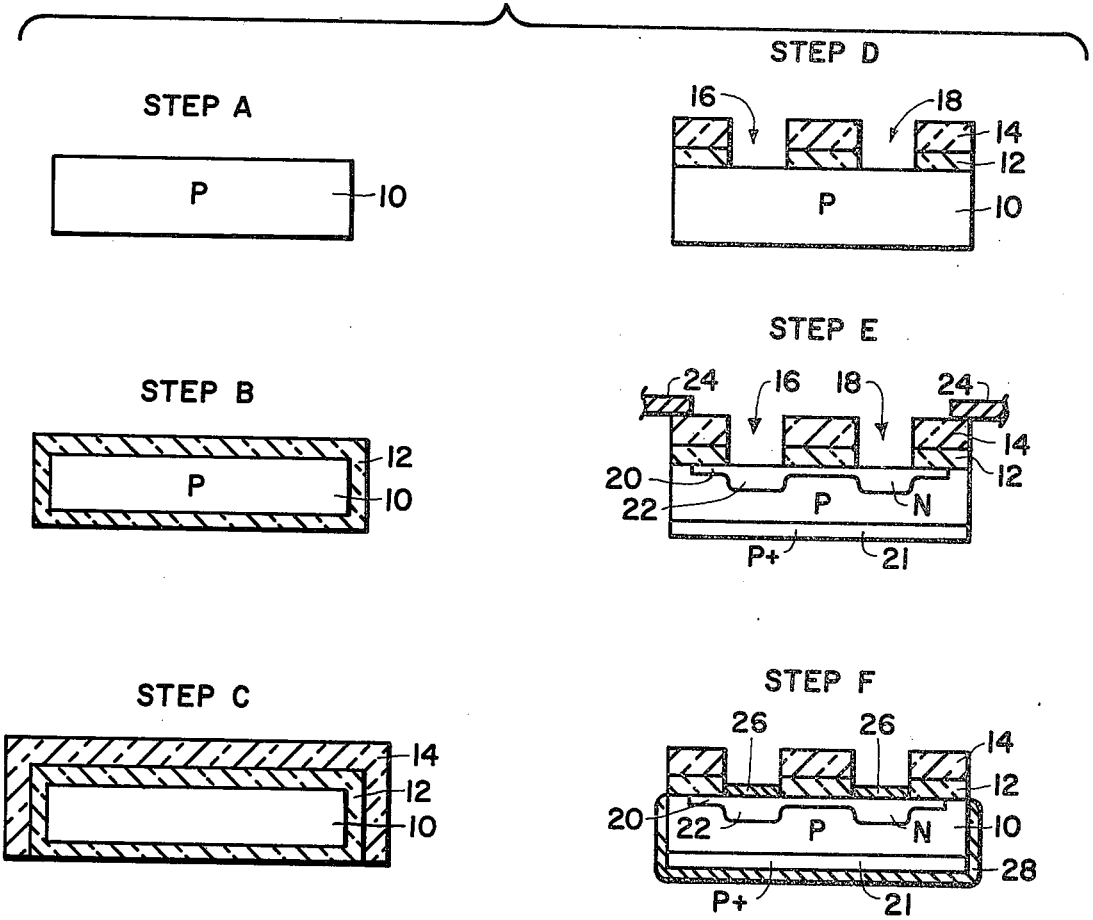
FIG. 1 illustrates a side elevation sectional view depicting a series of steps in the process of fabricating the semiconductor solar energy device of this invention.

Referring to Step A of FIG. 1, a semiconductor wafer or substrate 10 is used as the starting point for fabricating the semiconductor solar energy device of this invention. The semiconductor wafer or substrate 10 can be formed by various techniques including crytal pulling and subsequent wafer cutting and polishing or by other techniques such as dendritic growth or ribbon growth. Preferably, in this embodiment, the starting substrate for wafer 10 is of P-type conductivity which means that it is a semiconductor substrate or wafer such as silicon doped with an impurity which would exhibit P-type electrical conductivity characteristics. Examples of such dopants that would provide a P-type substrate or wafer are boron or aluminum. If desired, the starting wafer or substrate 10 can be of N type conductivity and the subsequently doped regions would be of opposite type conductivity to that described below. The P-type substrate 10 preferably has a thickness of about 10 mils, but can be made with a thickness in the range of about 1–30 mils, and a resistivity in the range of from about 0.1 to about 20 ohm-centimeters.

Referring to Step B of FIG. 1, a thin silicon dioxide layer 12 is preferably grown on the starting P-type substrate 10 and forms a coating around the substrate. The thin silicon dioxide layer 12 preferably has a thickness of between about 50 to about 300 Angstroms and most desirably has a thickness of between about 75 to about 100 Angstroms. This thin silicon dioxide layer 12 is necessary for achieving minimum surface state density and low recombination velocity.

Referring to Step C, a thicker silicon nitride layer 14 is deposited or formed on the top and incidentally on the side portion of the thin silicon dioxide layer 12. The silicon nitride layer is deposited by various well known silicon nitride chemical vapor deposition techniques and is preferably deposited at a temperature of 750° C or less to preserve etchability in HF solutions. The silicon nitride layer 14 has a thickness in the range of about 600 to about 1,300 Angstroms (preferably about 900 Angstroms) and the silicon dioxide layer 12 together with the silicon nitride layer 14 form the anti-reflective coating that is needed for the semiconductor solar energy device of this invention. The function of the anti-reflective coating or layer which is comprised of the silicon nitride layer 14 and the silicon dioxide layer 12 is to enhance the absorption of photons of light striking the anti-reflective layer into the semiconductor substrate or wafer. Accordingly, the thicknesses of the silicon nitride layer 14 and the silicon dioxide layer 12 together with the index of refraction of both the silicon nitride material and the silicon dioxide material serve to provide an excellent anti-reflective layer or coating for the semiconductor solar energy device of this invention. The use of these dielectric materials is well known in the semiconductor arts for other types of applications.

Referring to Step D, holes 16 and 18 are opened up through the silicon nitride layer 14 and the silicon dioxide layer 12 by using conventional photolithographic masking and etching techniques using an HF solution. Holes 16 and 18 are part of a continuous opening through the anti-reflective coating. The purpose of this step in the process of fabricating the semiconductor solar energy device of this invention is to define the geometry of subsequently formed metal ohmic contacts that will provide an electrical contact to the underlying semiconductor region. However, before the ohmic contacts are formed or deposited in the openings 16 and 18 these openings are used to provide a differential PN junction depth as shown in Step E.

With regard to Step E of FIG. 1, a doped region 20 and 22 are formed preferably using ion implantation techniques, but conventional diffusion techniques can be combined with the ion implantation doping techniques.

A doped region 20 which is of N-type conductivity and having an impurity concentration in the range of about $10^{14}$ to about $10^{16}$ impurities per cubic centimeter is formed by an ion implantation technique using a substrate or wafer holder 24 which is preferably made of metal and serves to hold the entire structure in position for the ion bombardment of the N-type impurities into the substrate 10. As can be seen with reference to the ion implanted region 20, a region beneath the metal holder 24 in the P-type substrate 10 is not converted to N-type conductivity due to the shielding effects of the metal holder 24. Thus, it can be readily apparent with respect to FIG. 2, the PN junction formed between region 20 and the substrate 10 does not extend out to the side of the substrate 10 thereby eliminating any chance of shorting when the ohmic contact is made to the backside portion of the semiconductor device structure.

As can be seen with reference to Step E of FIG. 1, the ion implantation process that is carried out causes a doped region to form beneath the anti-reflective layer or coating. This is created beneath the anti-reflection layer or coating by the penetration of ions therethrough.

A P+ region 21 located on the back or bottom portion of the substrate 10 is preferably formed by means of an ion implantation technique. The P+ region 21 has a surface impurity concentration of about $10^{21}$ atoms per cubic centimeter and serves to provide a semiconductor region that will permit a good ohmic contact to be made to the back side portion of the device and thereby provide an excellent electrical contact to the semiconductor substrate 10. Additionally, the P+ region 21 provides an electric field to aid in collecting minority carriers generated in the substrate 10.

As can be seen with reference to Step E of FIG. 1, a deeper doped region 22 is shown in the region beneath the openings 16 and 18. This occurs because the implanted ions in the semiconductor material beneath the openings 16 and 18 did not have to go through the anti-reflective coating. The portion of the doped region 20 that is underneath the anti-reflective coating has an impurity concentration profile which preferably provides the maximum concentration of impurities at the silicon-silicon dioxide interface and the impurity concentration is graded and decreases in concentration with increasing depth from the silicon-silicon dioxide interface. This is accomplished by selecting an ion implantation energy which will insure that the maximum concentration is preferably at the silicon-silicon dioxide interface or slightly above this interface and in the anti-reflective coating. This portion of the doped region 20 that is underneath the anti-reflective coating will have a PN junction depth of about 0.3 microns or less. The purpose of the deeper doped regions 22 is to provide deeper doped regions beneath the subsequent location of metal ohmic contacts and thereby serves to protect the device from shorting when the ohmic contact is sintered to provide a good electrical and mechanical contact to the semiconductor device.

In Step F, an electroless metal deposition operation is carried out wherein metal contacts 26 are formed in the openings 16 and 18 located in the anti-reflective coating. These electroless metal coatings 26 are formed in an electroless plating operation and create ohmic contacts to the N-type doped region 20 located on the substrate region 10. Simultaneous with the formation of the electroless metal ohmic contacts 26 is the formation of a thin metal ohmic contact 28 which is also an electroless contact and is located on the backside of the substrate 10 and is specifically in contact with the doped region 21. The electroless plating process to provide these ohmic contacts utilizes a plating solution which deposits a metal such as nickel into the exposed bare silicon regions. Thus, there is no need for separate photoresist, alignment or etching operations. If desired, contacts can be made to the front and backside of the semiconductor solar silicon energy device shown in Step F by using standard metal evaporation or sputtering techniques using a metal evaporation mask that has been aligned to the preohmic pattern. Also, electroplating can be used. If desired, sintering or alloying steps can be carried out subsequent to the deposition of the metal contact material to provide a good mechanical bond and electrical ohmic contact to the substrate and the doped regions thereof.

Figure 2:
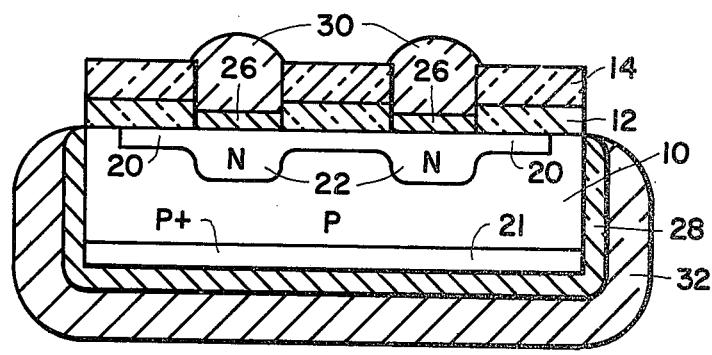
FIG. 2 depicts the semiconductor solar energy device of the last step of FIG. 1 with the addition of the solar metal contacts in electrical contact with the ohmic contacts on the top and bottom portions of the semiconductor solar energy device.

Referring to FIG. 2, a complete semiconductor solar energy silicon device is shown of the type fabricated in accordance with the Steps A through F of FIG. 1 with the addition of a solder contact 30 that is made to the metal contacts 26 on the top portion of the semiconductor solar energy device and a similar solder contact 32 is made to the backside portion of the semiconductor solar energy device and specifically in contact with the electroless metal coating 28 located in contact with the P+ doped region 21. This is done by conventional soldering techniques.

While the invention has been particularly shown and described in reference to the preferred embodiments thereof, it will be understood by those skilled in the art that changes in form and details may be made therein without departing from the spirit and scope of the invention.

We claim:

1. A semiconductor solar energy device comprising, in combination, a silicon substrate of one type conductivity having a doped region of the opposite type conductivity, said doped region being beneath and extending to a first surface of said substrate, metal ohmic contacts in electrical contact with said substrate and said doped region of the opposite type conductivity, respectively, and an anti-reflective dielectric coating in contact with said first surface of said silicon substrate and in contact with a surface of said doped region of the opposite type conductivity, said anti-reflective coating comprising a thin layer of silicon dioxide on said first surface of said silicon substrate and a thicker layer of silicon nitride on said layer of silicon dioxide, said doped region of the opposite type conductivity comprising a thin region in contact with said anti-reflective coating and a thicker region located beneath an opening in said anti-reflective coating where at least one of said metal ohmic contacts is in contact with said doped region of the opposite type conductivity.

2. A semiconductor solar energy device in accordance with claim 1 wherein said thin region of said doped region of the opposite type conductivity has a thickness less than about 0.3 microns, said thicker region of said doped region of the opposite conductivity type having a thickness greater than 0.3 microns.

3. A semiconductor solar energy device in accordance with claim 2 wherein said silicon dioxide layer has a thickness in the range of between about 75 to about 100 Angstroms, said silicon nitride layer has a thickness in the range of about 600 to about 1,300 Angstroms.

4. A semiconductor solar energy device in accordance with claim 3 wherein said silicon nitride layer has a thickness of about 900 Angstroms.

5. A semiconductor solar energy device in accordance with claim 1 wherein said semiconductor substrate has a first region of said one type conductivity located at a second surface of said substrate, said first region of said one type conductivity having a higher concentration of impurities than said substrate of said one type conductivity, one of said metal ohmic contacts being in contact with said first region of said one type conductivity; another of said metal ohmic contacts being in electrical contact with said doped region of the opposite type conductivity; including a first solder metal contact in electrical contact with said metal ohmic contact to said first region of said one type conductivity, and a second separate solder metal contact in electrical contact with said metal ohmic contact that is in electrical contact with said doped region of opposite type conductivity.

* * * * *